(12) United States Patent
Kanteti

(10) Patent No.: US 10,862,484 B2
(45) Date of Patent: Dec. 8, 2020

(54) BIDIRECTIONAL VOLTAGE LEVEL TRANSLATOR HAVING OUTPUT DRIVER STAGGERING CONTROLLED BY VOLTAGE SUPPLY

(71) Applicant: Texas Instruments Incorporated, Dallas, TX (US)

(72) Inventor: Amar Kanteti, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 16/410,802

(22) Filed: May 13, 2019

(65) Prior Publication Data

US 2020/0313674 A1   Oct. 1, 2020

(30) Foreign Application Priority Data

Mar. 29, 2019   (IN) .............................. 201941012333

(51) Int. Cl.
*H03K 19/0185*   (2006.01)
*H03K 3/356*   (2006.01)

(52) U.S. Cl.
CPC ............... *H03K 19/018521* (2013.01); *H03K 3/356113* (2013.01)

(58) Field of Classification Search
CPC ............... H03K 19/00; H03K 19/0013; H03K 19/00361; H03K 19/00338; H03K 19/017; H03K 19/01721; H03K 19/017509; H03K 19/01812; H03K 19/0185; H03K 19/018507; H03K 19/018521; H03K 19/0944; H03K 19/1733; H03K 19/1774; H03K 19/17784; H03K 19/20; H03K 3/012; H03K 3/013; H03K 3/02335; H03K 3/037; H03K 3/356; H03K 3/356113; H03K 3/356182; H03K 3/3562; H03K 17/005; H03K 17/04123; H03K 17/063; H03K 17/08122; H03K 17/0822; H03K 17/102; H03K 17/161; H03K 17/162; H03K 17/20; H03K 17/22; H03K 17/223; H03K 17/302; H03K 17/56; H03K 17/687; H03K 17/6871; H03K 17/693; H03K 2217/0018; H03K 2217/0036; H03K 2217/0063;

(Continued)

(56) References Cited

U.S. PATENT DOCUMENTS 10,027,325 B1   7/2018   Graves
10,110,231 B1   10/2018   Graves
(Continued)

OTHER PUBLICATIONS

Spurlin, C. and Stein, D., Advanced CMOS Logic, Texas Instruments Designer's Handbook, 1988, pp. 3-1 through 3-12, Texas Instruments, Dallas, TX.

(Continued)

*Primary Examiner* — Diana J. Cheng
(74) *Attorney, Agent, or Firm* — Lawrence J. Bassuk; Charles A. Brill; Frank D. Cimino

(57) ABSTRACT

A voltage level translator translates signals between first and second voltage domains. An output buffer for a channel thereof includes a first plurality of PFETs and a first plurality of NFETS that are coupled to provide staggering of the output signal. A supply difference sensing circuit can disable staggering when an input voltage supply is greater than or equal to a VCCI trigger for the output voltage supply.

16 Claims, 10 Drawing Sheets

(58) Field of Classification Search
CPC ..... H03K 2217/0081; H03K 2017/066; H03K 2017/0803; H03K 2017/6875; H03K 2017/6878; H03K 2005/00013; H03K 2005/00019; H03K 21/40; H03K 21/403; H03K 5/01; H03K 5/08; H03K 5/13; H03K 5/133; H03K 5/1534; H03K 5/159; H03K 5/24; H03K 5/2472
USPC .......................................... 327/108–112, 333
See application file for complete search history.

(56) References Cited

U.S. PATENT DOCUMENTS

2012/0139607 A1\* 6/2012 Ilzuka ..................... H03F 3/505
327/333
2017/0019093 A1\* 1/2017 Kanda ................ H01L 29/0696

OTHER PUBLICATIONS

Madani, Navid, Simultaneous-Switching Noise Analysis for Texas Instruments FIFO Products, Mar. 1996, pp. 1-18, Texas Instruments, Dallas, TX.

\* cited by examiner

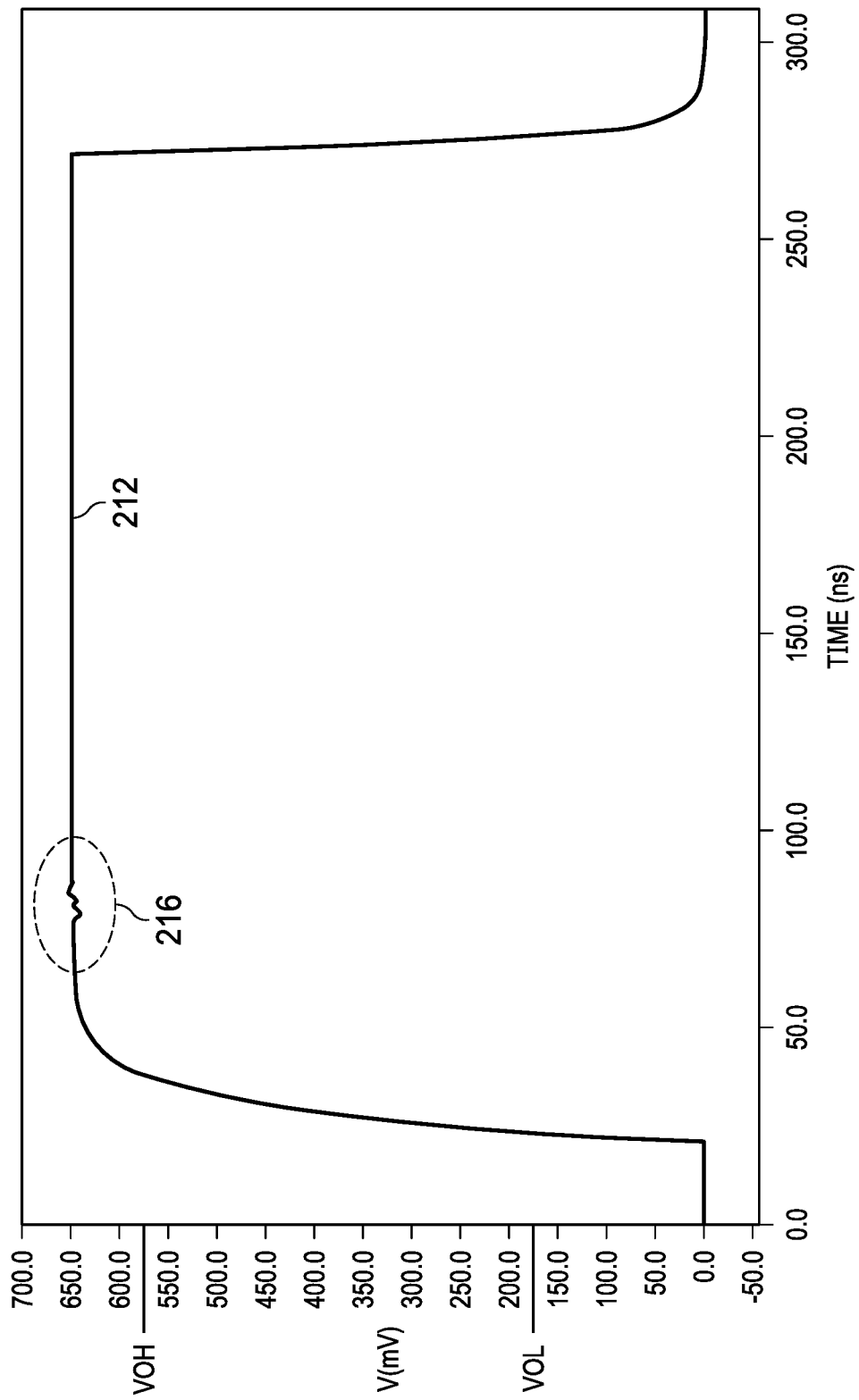

BIDIRECTIONAL VOLTAGE LEVEL TRANSLATOR HAVING OUTPUT DRIVER STAGGERING CONTROLLED BY VOLTAGE SUPPLY

CROSS-REFERENCE TO RELATED APPLICATIONS

The present application claims priority from Indian Patent Application No. 201941012333, which was filed Mar. 29, 2019, is titled "SUPPLY DIFFERENCE CONTROLLED OUTPUT DRIVER STAGGERING ON-OFF TECHNIQUE TO IMPROVE DATA RATE WITH MONOTONIC OUTPUTS IN BI DIRECTIONAL TRANSLATORS," which is hereby incorporated by reference in its entirety.

FIELD OF THE DISCLOSURE

Disclosed embodiments relate generally to the field of voltage level translators. More particularly, and not by way of any limitation, the present disclosure is directed to a bidirectional voltage-level translator having output driver staggering controlled by voltage supply differences.

SUMMARY

Disclosed embodiments provide a bidirectional voltage-level translator that can operate with voltage inputs that vary between 3.6 volts and 0.65 volts. The output buffer for the voltage-level translator combines output edge control of the output signal, also referred to as staggering, which operates primarily for low-to-high voltage translation when the voltage supply differences are large. The voltage-level translator senses the difference in the input and output supply voltages and switches the staggering circuit on for larger voltage differences when translating from a low voltage to a high voltage and off for smaller voltage differences or when translating from a high voltage to a low voltage.

In one aspect, an embodiment of a bidirectional voltage level translator chip is disclosed. The bidirectional voltage level translator chip includes a first supply voltage pin for coupling to receive a first supply voltage for a first voltage domain; a second supply voltage pin for coupling to receive a second supply voltage for a second voltage domain; a third supply voltage pin for coupling to a ground plane to provide a lower rail; and a voltage level translator channel coupled to receive an input signal operating in the first voltage domain on a first data pin and to provide an output signal operating in the second voltage domain on a second data pin, the voltage level translator channel comprising an output buffer coupled to provide the output signal, the output buffer comprising: a first plurality of P-type field effect transistors (PFETs) coupled in parallel between the second supply voltage and the output signal, the first plurality of PFETs having a standard threshold voltage Vt, a gate of each of the first plurality of PFETs being coupled to a respective one of a plurality of first resistors, the respective ones of the plurality of first resistors being coupled in series and coupled to receive the first gate control signal; a first plurality of switches, each switch of the first plurality of switches being coupled in parallel with a respective one of the plurality of first resistors; a first plurality of N-type field effect transistors (NFETs) coupled in parallel between the output signal and the lower rail, the first plurality of NFETs having a standard Vt, a gate of each of the first plurality of NFETs being coupled to a respective one of a plurality of second resistors, the respective ones of the plurality of second resistors being coupled in series and coupled to receive the second gate control signal; and a second plurality of switches, each switch of the second plurality of switches being coupled in parallel with a respective one of the plurality of second resistors, wherein the first plurality of switches and the second plurality of switches are coupled to be closed when the first supply voltage is greater than or equal to a respective VCCI trigger for the second supply voltage and to be open when the first supply voltage is less than the respective VCCI trigger.

In another aspect, an embodiment of an output buffer for a voltage level translator that is coupled to translate an input signal that operates in a first voltage domain that has a first supply voltage into an output signal that operates in a second voltage domain that has a second supply voltage is disclosed. The output buffer includes a first plurality of P-type field effect transistors (PFETs) coupled in parallel between the second supply voltage and the output signal, the first plurality of PFETs having a standard threshold voltage (Vt), a gate of each of the first plurality of PFETs being coupled to a respective one of a plurality of first resistors, the respective ones of the plurality of first resistors being coupled in series and coupled to receive the first gate control signal; a first plurality of switches, each switch of the first plurality of switches being coupled in parallel with a respective one of the plurality of first resistor; a first plurality of N-type field effect transistors (NFETs) coupled in parallel between the output signal and the lower rail, the first plurality of NFETs having a standard Vt, a gate of each of the first plurality of NFETs being coupled to a respective one of a plurality of second resistors, the respective one of the plurality of second resistors being coupled in series and coupled to receive the second gate control signal; and a second plurality of switches, each switch of the second plurality of switches being coupled in parallel with a respective one of the plurality of second resistors, wherein the first plurality of switches and the second plurality of switches are coupled to be closed when the first supply voltage is greater than or equal to a respective VCCI trigger for the second supply voltage and to be open when the first supply voltage is less than the respective VCCI trigger.

In yet another aspect, an embodiment of a method of operating a voltage level translator is disclosed. The method includes providing a voltage-level translator embodied on an integrated circuit (IC) chip, each output buffer of the voltage-level translator comprising a plurality of field effect transistors and a plurality of resistors coupled to provide staggering of an output signal; coupling a first supply voltage for a first voltage domain to a first supply voltage pin; coupling a second supply voltage for a second voltage domain to a second supply voltage pin; coupling a first data pin for a first channel to receive a first signal that operates in the first voltage domain; coupling a second data pin for the first channel to provide a translated first signal that operates in the second voltage domain, wherein the voltage-level translator is coupled to determine whether the first supply voltage is greater than or equal to a first VCCI trigger for the second supply voltage and is further coupled to disable staggering in a first output buffer of the first channel responsive to determining that the first supply voltage is greater than or equal to the first VCCI trigger.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIG. 2D depicts an example output waveform provided by an output buffer according to an embodiment of the disclosure;

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 4:
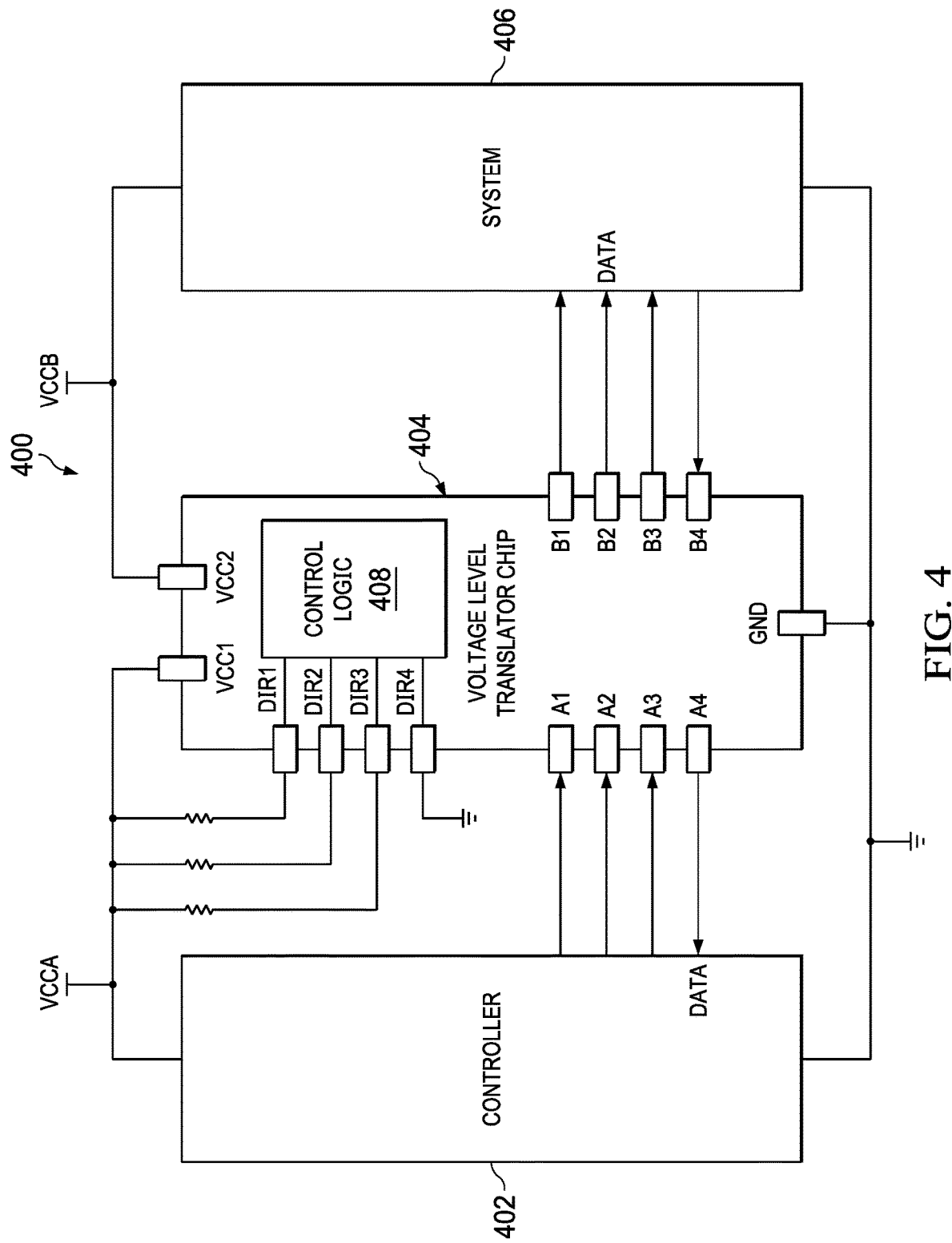
FIG. 4 illustrates a system in which an embodiment according to the disclosure can be utilized.

FIG. 4 depicts a system 400 in which a bidirectional voltage level translator chip 404 is coupled to translate the voltage level of signals passed between a controller 402 and system 406. A first supply voltage pin VCC1 is for coupling to a first voltage domain, which uses a first supply voltage VCCA that is used by controller 402; a second supply voltage pin VCC2 is for coupling to a second voltage domain, which uses a second supply voltage VCCB that is used by system 406; and a third supply voltage pin GND is for coupling to a third supply voltage, which may be a ground plane, in order to provide a lower rail. In the embodiment shown, bidirectional voltage level translator chip 404 has four channels for translation, although bidirectional voltage level translator chip 404 can also have eight, sixteen or any number of channels. Data pin A1 and data pin B1 are coupled to a first channel; data pin A2 and data pin B2 are coupled to a second channel; data pin A3 and data pin B3 are coupled to a third channel; and data pin A4 and data pin B4 are coupled to a fourth channel.

In this embodiment, a first direction pin DIR1, second direction pin DIR2, third direction pin DIR3 and fourth direction pin DIR4 are each coupled to indicate the direction of information flow on a respective channel. In other embodiments, a direction pin can be associated with a group of two or more channels. Coupling any one of the direction pins to first supply voltage VCCA indicates that the flow of information on a respective channel or group of channels is from the first voltage domain to the second voltage domain, while coupling any one of the direction pins to the third supply voltage, e.g., the lower rail, indicates that the flow of information on a respective channel or group of channels is from the second voltage domain to the first voltage domain. In the embodiment shown, the first channel with data pin A1 and data pin B1, the second channel with data pin A2 and data pin B2 and the third channel with data pin A3 and data pin B3 are coupled to handle data flowing from the first voltage domain to the second voltage domain while the fourth channel with data pin A4 and data pin B4 handles information flowing from the second voltage domain to the first voltage domain.

Since as semiconductor devices have steadily shrunk, the voltages at which the semiconductor devices operate have grown lower, it follows that the voltages at which controller 402 and system 406 operate can depend on when the chips were created. Given the current state of the art, first supply voltage VCCA and second supply voltage VCCB can vary by an order of magnitude. For example, one of controller 402 and system 406 may use a voltage of 3.6V while the other uses a voltage of 0.65V. Providing the capability of translating signals between these two extremes provides numerous challenges to circuit design.

Figure 5A:
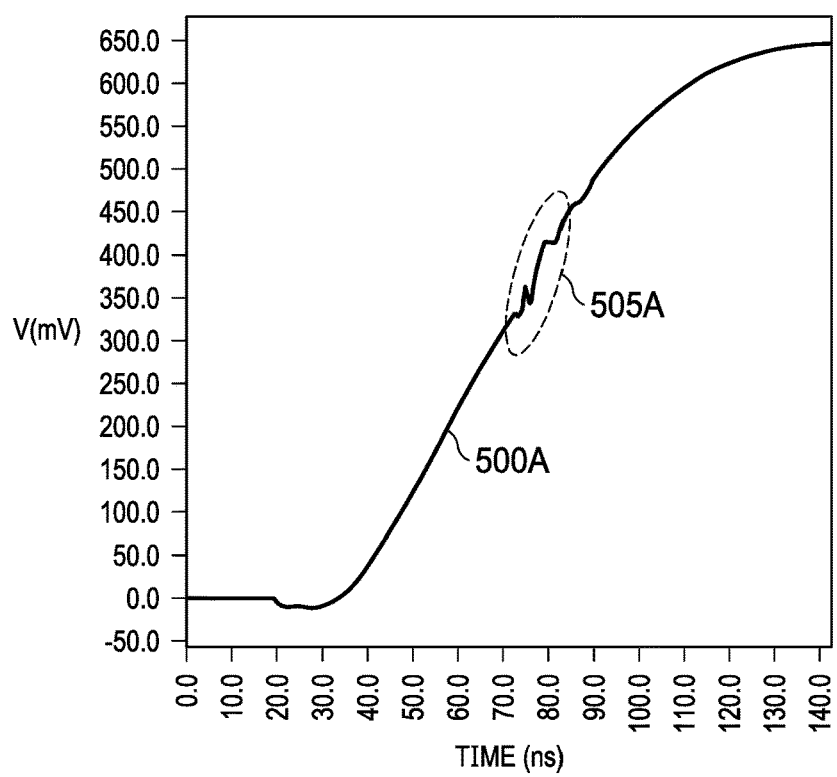
FIGS. 5A and 5B depict a rising edge of a waveform and a falling edge of a waveform respectively in which noise has caused non-monotonic behavior in the output signal.
Figure 5B:
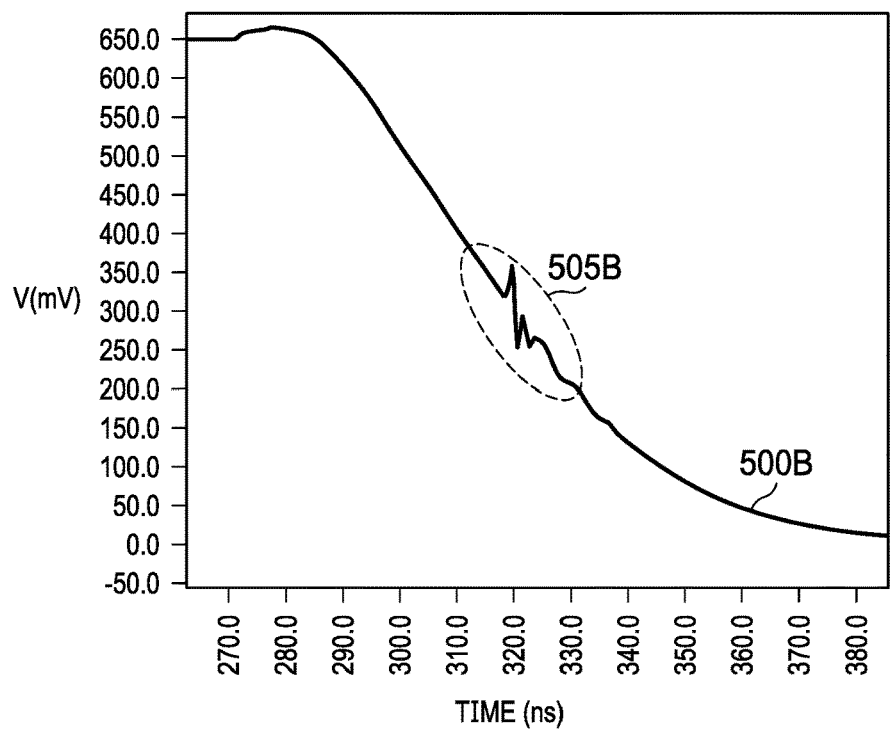

One such challenge is illustrated in FIGS. 5A and 5B, which show respectively the rising edge of output signal 500A and the falling edge of output signal 500B from a voltage translator. In each of FIGS. 5A, 5B, the monotonicity of output signals 500A, 500B is destroyed by glitches 505A, 505B respectively, which are circled in the figures. Glitches such as seen in output signals 500A, 500B are generally caused by voltage translators that are converting signals that are passed in two directions between a low voltage domain, e.g. 0.65V, and a high voltage domain, e.g., 3.6V. With multiple signals passing through a voltage level translator chip such as bidirectional voltage level translator chip 404, parasitic interactions between signal lines that lie close to each other cause the noise created by a low-to-high conversion to couple to the signals from voltage translators that are performing a high-to-low conversion. When glitches appear during the rising or falling phase of a signal, the receiver can misinterpret the signal and cause errors.

In one example, which illustrates a worst case scenario, controller 402 of FIG. 4 has a first supply voltage VCCA of 0.65V and system 406 has a second supply voltage VCCB of 3.6V. The first channel, second channel and third channel are configured to convert signals from A to B, i.e., 0.65V to 3.6V and the fourth channel is configured to convert signals from B to A, i.e., 3.6V to 0.65V. The first channel, second channel and third channel draw a large current from second supply voltage VCCB. This large current will create both supply bounce and ground bounce. If all channels are sharing the same ground and supply voltage, the output from the fourth channel, which is providing translation from 3.6V to 0.65V, is impacted through the noise coupling from the other channels. The occurrence of this noise during the rising or falling phases of the signal then causes the type of glitches seen in FIGS. 5A and 5B, which in turn can cause the misinterpretation of signals.

Figure 6:
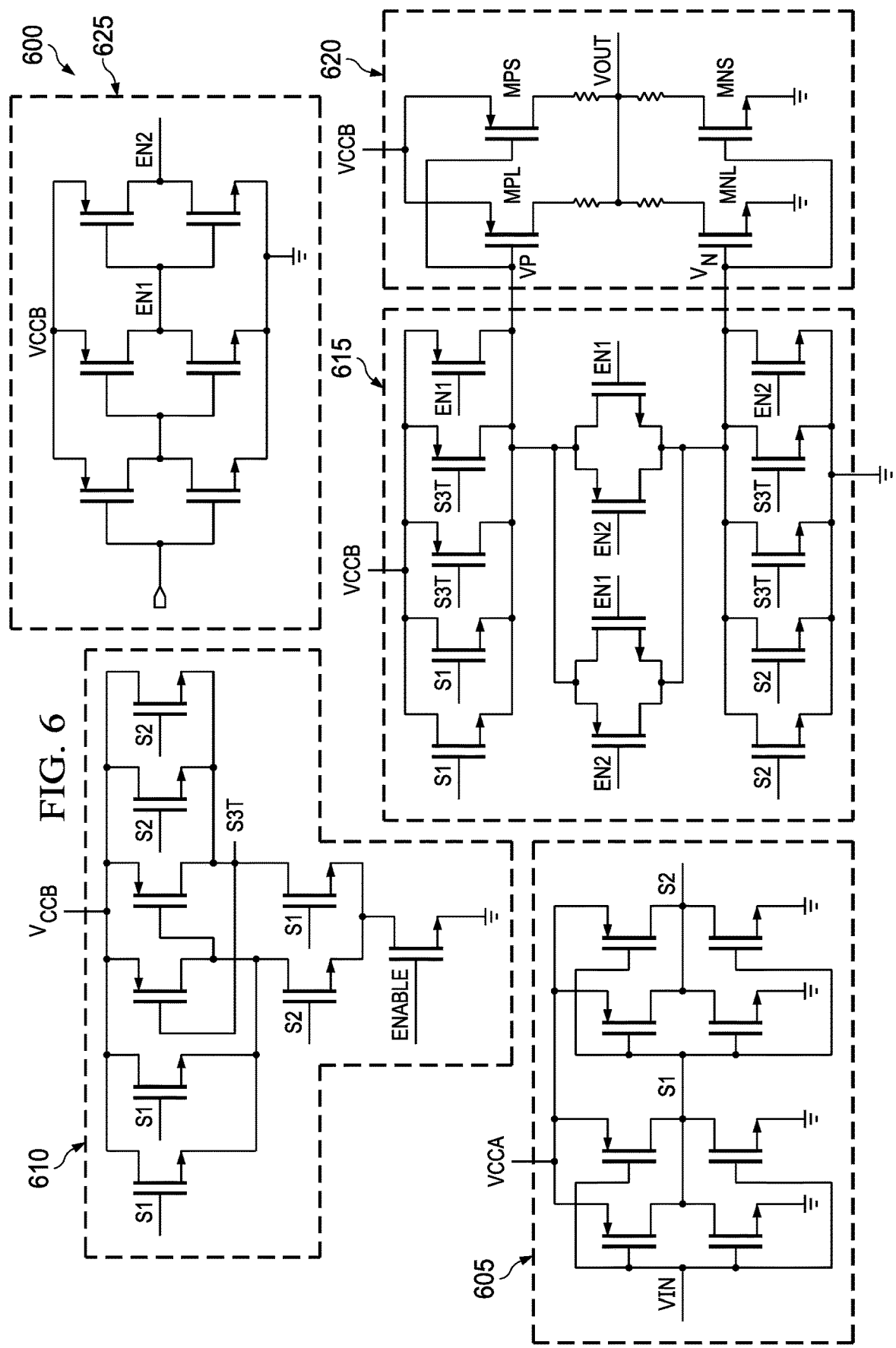
FIG. 6 depicts an example of the circuits in one channel of a bidirectional voltage level translator into which an embodiment of the disclosure can be incorporated.

FIG. 6 depicts half of an example voltage level translator channel 600 for translating a signal between the A voltage domain and the B voltage domain and is taken from U.S. Pat. No. 10,027,325, issued Jul. 17, 2018 in the name of Christopher Michael Graves, which is incorporated by reference herein in its entirety. The circuit shown in FIG. 6 translates a signal from the A voltage domain to the B voltage domain, while an identical circuit (not specifically shown) is coupled to translate a signal from the B voltage domain to the A voltage domain. Only one of these two circuits that make up voltage level translator channel 600 is active at a time while the output buffer of the inactive circuit is placed in a high impedance mode; the directionality of the conversion is determined by the voltage coupling of the corresponding direction pin as explained with reference to FIG. 4.

The following description provides a quick overview of the circuits of FIG. 6; further details can be found in the patent noted above. Voltage level translator channel 600 includes an input buffer circuit 605, a voltage translator circuit 610, gate control circuit 615, output buffer circuit 620 and enable/disable control circuit 625. Input buffer circuit 605 receives an input signal VIN, produces first control signal S1 and second control signal S2, and is the only one of the circuits that is powered by first supply voltage VCCA, which is in the "A" voltage domain. First and second control signals S1 and S2 are used to drive the transistors in voltage translator circuit 610 in order to provide output control signal S3T, which is now operating in the "B" voltage domain. In gate control circuit 615, first and second control signals S1, S2 and output control signal S3T are all utilized to drive transistors in this circuit to produce gate control signals VP, VN that are passed to output buffer circuit 620. Gate control signals VP and VN control the gates of the output transistors used to provide output signal VOUT. Enable/disable circuit 625 provides enable signals EN1, EN2, which ensure that gate control signals VP and VN can place the output buffer circuit in high impedance state when necessary.

Because of the difficulties inherent in providing voltage translation across a wide voltage range, voltage level translator channel 600 is designed to provide a parallel threshold voltage (Vt) architecture in which low Vt transistors are coupled in parallel with standard Vt transistors. Although not specifically labeled as such, examples of low Vt transistors coupled in parallel with standard Vt transistors can be seen in each of input buffer circuit 605, voltage translator circuit 610 and gate control circuit 615, where two transistors coupled in parallel are both controlled by any one of input signal VIN, first control signal S1, second control signal S2, or output control signal S3T. In output buffer circuit 620, two P-type transistors, i.e., a low Vt P-type field effect transistor (PFET) MPL and standard Vt transistor MPS are coupled in parallel between second supply voltage VCCB and output signal VOUT and each receives gate control signal VP. Similarly, two N-type transistors, i.e., low Vt N-type field effect transistor (NFET) MNL and standard Vt NFET MNS are coupled in parallel between output signal VOUT and the lower rail and each receives gate control signal VN.

The voltages that are coupled to a particular circuit for translation determines whether the standard Vt or the low Vt transistors contribute most to the conversion. For example, when a voltage of 0.65V is used for the supply voltage of a circuit, standard Vt transistors will generally not turn on and the low Vt transistors predominate. When a voltage of 3.6V is used for the supply voltage of a circuit, the low Vt transistors cannot pass enough current to provide the necessary output voltages, so the standard Vt transistors predominate in this situation.

Co-pending U.S. patent application Ser. No. 16/213,230, (hereinafter the '230 application) titled "Bidirectional Level Translator Having Noise Reduction and Improved Data Rate" was filed on Dec. 7, 2018 in the names of Amar Kanteti and Ankur Kumar Singh and is hereby incorporated by reference in its entirety. The '230 application discloses an output buffer that is a modification of output buffer circuit 620 of voltage level translator channel 600. The modified output buffer includes a combination of staggering of the standard Vt NFETs and of the P-type field effect transistors (PFETs), which improves noise on high-voltage outputs, with boosting, which improves the monotonic behavior and can improve the data rate for low-voltage outputs.

The circuit provided in the '230 application is effective in providing monotonic output in situations in which the difference between the first supply voltage from the first voltage domain and the second supply voltage from the second voltage domain is large, e.g., first supply voltage VCCA is 3.6V and second supply voltage VCCB is 0.65V. One issue that Applicant identified with regard to the '230 application is that staggering is present for every input/output voltage combination, even when staggering is not required for lower supply voltage differences, e.g., when one supply voltage is 1.8V and a second supply voltage is 3.6V. When the voltage differences are lower, the ground noise generated by the higher output channels can be tolerated by lower voltage output channels. However, the use of staggering reduces the data rate for all the supply voltage ranges irrespective of the supply voltage difference.

Figure 1:
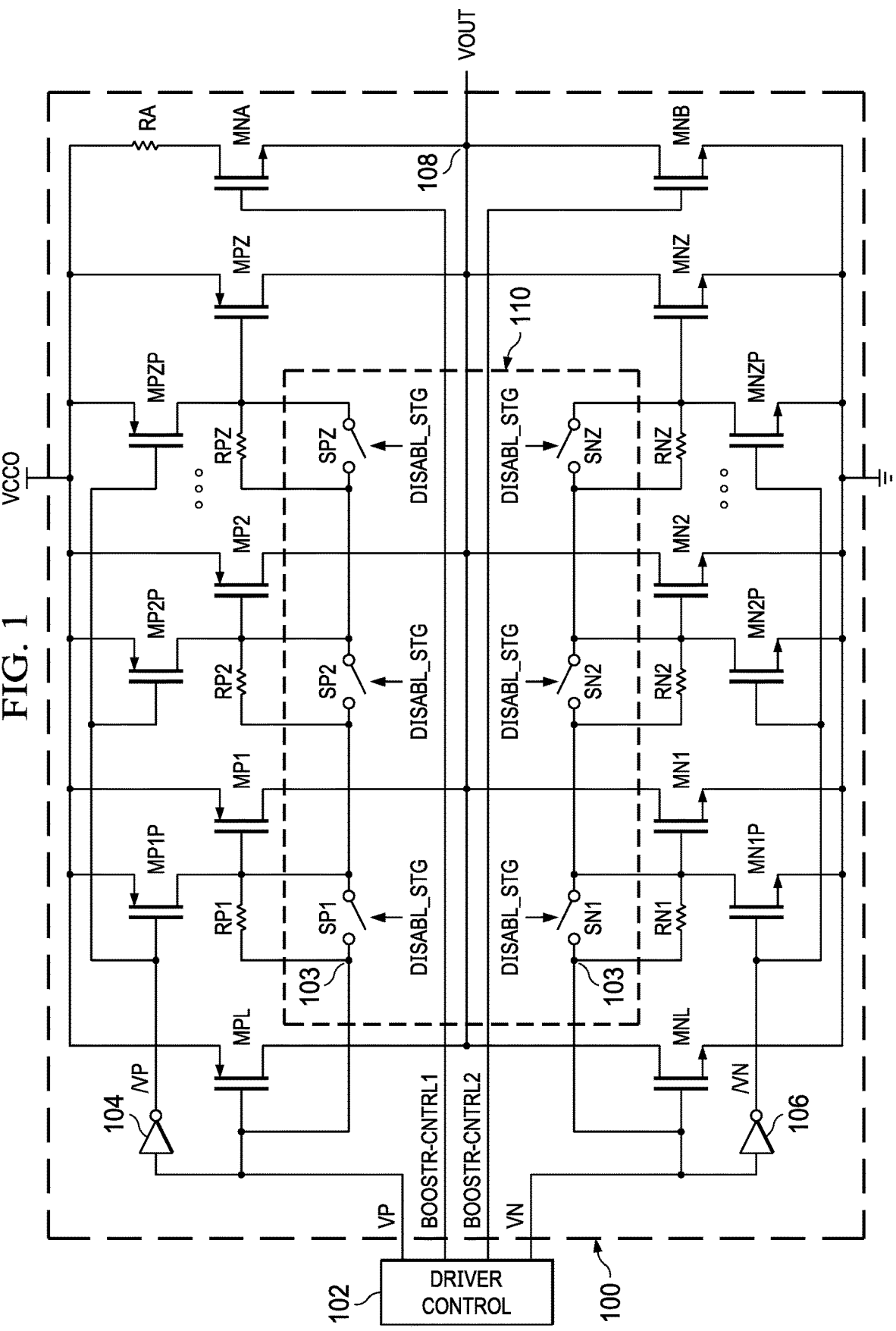
FIG. 1 depicts an example of an output buffer according to an embodiment of the disclosure.

FIG. 1 illustrates a circuit diagram of output buffer 100, which provides a further modification to the output buffer of the '230 application, that can disable staggering when staggering is unnecessary. For the channel of which output buffer 100 is a part, output supply voltage VCCO represents the upper supply voltage for the output signal VOUT, while VCCI, which is mentioned below, is the upper supply voltage for the input signal VIN shown in FIG. 6. For example, given the couplings of the direction pins in FIG. 4, first supply voltage VCCA provides the input supply voltage VCCI and second supply voltage VCCB provides the output supply voltage VCCO for the first channel, second channel and third channel. Similarly, second supply voltage VCCB provides the input supply voltage VCCI and first supply voltage VCCA provides the output supply voltage VCCO for the fourth channel.

Output buffer 100 includes a low Vt PFET MPL and a first plurality of PFETs MP1-MPZ that have standard Vt. Each of low Vt PFET MPL and the first plurality of PFETs MP1-MPZ are coupled in parallel between the output supply voltage VCCO and the output signal VOUT. The gates of the first plurality of PFETs MP1-MPZ are each coupled to a respective one of a plurality of first resistors RP1-RPZ and the plurality of first resistors RP1-RPZ are coupled in series between node 103 and the gate of PFET MPZ. A first plurality of switches SP1-SPZ are provided, with each of the first plurality of switches SP1-SPZ coupled in parallel with a respective one of the plurality of first resistors RP1-RPZ, such that when each of the first plurality of switches SP1-SPZ are closed, the respective one of the plurality of first resistors RP1-RPZ is bypassed. The first plurality of switches SP1-SPZ is controlled by disable-staggering signal DISABL_STG.

During operation of output buffer 100, driver control 102 provides first gate control signal VP and second gate control signal VN to output buffer 100. First booster control signal BOOSTR-CNTRL1 and second booster control signal BOOSTR-CNTRL2 are also shown as being provided by driver control 102; in one embodiment, these booster control signal are the first and second control signals S1 and S2 from input buffer circuit 605. The first gate control signal VP is provided to the gate of low Vt PFET MPL and to first node 103. In one embodiment, when disable-staggering signal DISABL_STG is low, the first plurality of switches SP1-SPZ are open and first gate control signal VP is passed sequentially from first node 103 through each of the plurality of first resistors RP1-RPZ and to respective ones of the first plurality of PFETs MP1-MPZ. As first gate control signal VP passes through each of the plurality of first resistors RP1-RPZ, each resistor introduces a small delay, e.g., one nanosecond, so that the gates of the first plurality of PFETs MP1-MPZ are turned on at staggered intervals. This staggering decreases the noise caused by the switching of output buffer 100. In the same embodiment, when disable-staggering signal DISABL_STG is high, the first plurality of switches SP1-SPZ are closed and first gate control signal VP is passed from first node 103 through each of the first plurality of switches SP1-SPZ to respective ones of the first plurality of PFETs MP1-MPZ. Because there is no delay caused by passing through sequential resistors, each of the first plurality of PFETs MP1-MPZ turns on at the same time, providing a faster signal.

A second plurality of PFETs MP1P-MPZP are each coupled between the output supply voltage VCCO and the gate of a respective one of the first plurality of PFETs MP1-MPZ to act as pull-up transistors that can turn off the first plurality of PFETs MP1-MPZ quickly. Inverter 104 provides an inverse of the first gate control signal NP to provide a signal that controls the gates of the second plurality of PFETs MP1P-MPZP.

Output buffer 100 also includes a low Vt NFET MNL and a first plurality of NFETs MN1-MNZ that have a standard Vt. Each of low Vt NFET MNL and the first plurality of NFETs MN1-MNZ are coupled in parallel between the output signal VOUT and the lower rail. The gates of the first plurality of NFETs MN1-MNZ are each coupled to a respective one of a plurality of second resistors RN1-RNZ and the plurality of second resistors RN1-RNZ are coupled in series. A second plurality of switches SN1-SNZ are provided, with each of the second plurality of switches SN1-SNZ coupled in parallel with a respective one of the plurality of second resistors RN1-RNZ, such that when each of the second plurality of switches SN1-SNZ are closed, the respective one of the plurality of second resistors RN1-RNZ are bypassed. The second plurality of switches SN1-SNZ is also controlled by disable-staggering signal DISABL_STG.

During operation of output buffer 100, driver control 102 provides a second gate control signal VN to the gate of low Vt NFET MNL and to second node 105. In one embodiment, when disable-staggering signal DISABL_STG is low, the second plurality of switches SN1-SNZ are open and second gate control signal VN is passed sequentially from second node 105 through each of the plurality of second resistors RN1-RNZ and to the respective gates of the first plurality of NFETS MN1-MNZ. As second gate control signal VN passes through each of the plurality of second resistors RN1-RNZ, each resistor again introduces a small delay, so that the gates of the first plurality of NFETs MN1-MNZ are turned on at staggered intervals. In the same embodiment, when disable-staggering signal DISABL_STG is high, the second plurality of switches SN1-SNZ are closed and second gate control signal VN is passed sequentially from second node 105 through each of the second plurality of switches SN1-SNZ to the gates of the first plurality of NFETs. Because there is no delay introduced by passing through sequential resistors, each of the first plurality of NFETs MN1-MNZ turns on at the same time, providing a stronger signal.

The first plurality of switches SP1-SPZ and the second plurality of switches SN1-SNZ together form a staggering-enable-disable circuit 110 that, in conjunction with a circuit to provide disable-staggering signal DISABL_STG, provides the ability to utilize staggering of the output signal VOUT when necessary, but to bypass staggering at other times. Control of staggering-enable-disable circuit 110 will be discussed with regard to FIG. 1A, which depicts an embodiment of a circuit to provide disable-staggering signal DISABL_STG.

Continuing with FIG. 1, second plurality of NFETs MN1P-MNZP are each coupled between the gate of a respective one of the first plurality of NFETs MN1-MNZ and the lower rail to act as pull-down transistors that can turn off the first plurality of NFETs MN1-MNZ quickly. Inverter 106 provides an inverse of the second gate control signal NN to provide a signal that controls the gates of NFETs MN1P through MNZP.

A third resistor RA is coupled in series with a first booster NFET MNA and a second booster NFET MNB between the output supply voltage VCCO and the lower rail, with a point 108 between the source of NFET MNA and the drain of NFET MNB being coupled to help provide output signal VOUT. Both first booster NFET MNA and second booster NFET MNB are standard Vt transistors. Driver control circuit 102 provides both first gate control signal VP and second gate control signal VN and also provides two additional booster control signals BOOSTR-CNTRL1, BOOSTR-CNTRL2, which are provided respectively to the gates of first booster NFET MNA and second booster NFET MNB.

Unlike first gate control signal VP and second gate control signal VN, which are generated in the voltage domain of output supply voltage VCCO, first booster control signal BOOSTR-CNTRL1 and second booster control signal BOOSTR-CNTRL2 are generated in the voltage domain of the input supply voltage VCCI, e.g., first supply voltage VCCA in FIG. 6. In one embodiment, booster control signals BOOSTR-CNTRL1, BOOSTR-CNTRL2 are the first and second control signals S1 and S2 from input buffer circuit 605. If output buffer 100 is disabled, i.e., placed in high-impedance mode, booster signals BOOSTR-CNTRL1, BOOSTR-CNTRL2 have binary low values.

When output buffer 100 is receiving an output supply voltage VCCO that is high, e.g., 3.6V, while the input supply voltage VCCI is low, e.g., 0.65V, staggering is enabled and the first plurality of PFETs MP1-MPZ and the first plurality of NFETs MN1-MNZ operate to reduce noise on the supply voltages and on the lower rail. Low Vt PFET MPL and low Vt NFET MNL are fully turned on but do not pass enough current to contribute significantly to output signal VOUT. At the same time, because first and second booster NFETs MNA, MNB are controlled by first booster control signal BOOSTR-CNTRL1 and second booster control signal BOOSTR-CNTRL2, which are produced using input supply voltage VCCI, booster NFETs MNA, MNB will not turn on, since the respective control signals do not exceed the threshold voltage for first booster NFET MNA and second booster NFET MNB. In a similar example in which the difference between the input supply voltage VCCI and the output supply voltage VCCO is not as large, e.g., input supply voltage VCCI is 1.2 V and output supply voltage VCCO is 3.6 V, booster NFETs MNA and MNB, which are standard Vt transistors, may switch on, but the current from booster NFETS MNA and MNB will not be sufficient to change the state of the output.

In the opposite situation, when input supply voltage VCCI is high (3.6V) and output supply voltage VCCO is low (0.65V) the first plurality of PFETs MP1-MPZ and the first plurality of NFETs MN1-MNZ will not turn on; low Vt PFET MPL and low Vt NFET MNL will turn on and first booster NFET MNA and second booster NFET MNB will turn on very quickly due to their strong booster control signals BOOSTR-CNTRL1, BOOSTR-CNTRL2. By switching first booster NFET MNA and second booster NFET MNB quickly, received noise does not appear on the rising or falling edge of the signal.

Although the staggering of a higher voltage signal as explained in the preceding paragraphs can avoid many problems with noise, staggering also lowers the data rate and increases propagation delays. For the high voltage differences that can be coupled to a voltage translator that incorporates output buffer 100, the trade-off between noise and data rate is necessary, but when the voltage differences are smaller, lowering the data rate unnecessarily is undesirable. Accordingly, it was determined that staggering should be disabled when not needed. To that end, the magnitude of the ground bounce, which provides the attendant noise, and the peak ground current were determined for various voltages as follows in Table 1:

TABLE 1

| VCCO | Ground Bounce | Ground peak current |
|---|---|---|
| 3.6 | 0.66 | 120 mA |
| 3.3 | 0.6 | 107 mA |
| 3 | 0.55 | 91 mA |
| 2.7 | 0.5 | 77.4 mA |
| 2.4 | 0.43 | 64 mA |

As the output voltage is reduced, both shoot through current and ground bounce go down, decreasing the need for staggering. As demonstrated in Table 1, reducing the supply voltage by ten percent also reduces the ground bounce by ten percent. It was determined that a VCCI trigger could be determined for each output voltage, i.e., for each output voltage, a minimum input voltage could be determined that does not require staggering. If the input voltage to a translator channel is at or above the VCCI trigger, staggering would be disabled for that channel using the plurality of first switches SP1-SPZ and the plurality of second switches SN1-SNZ.

Figure 1A:
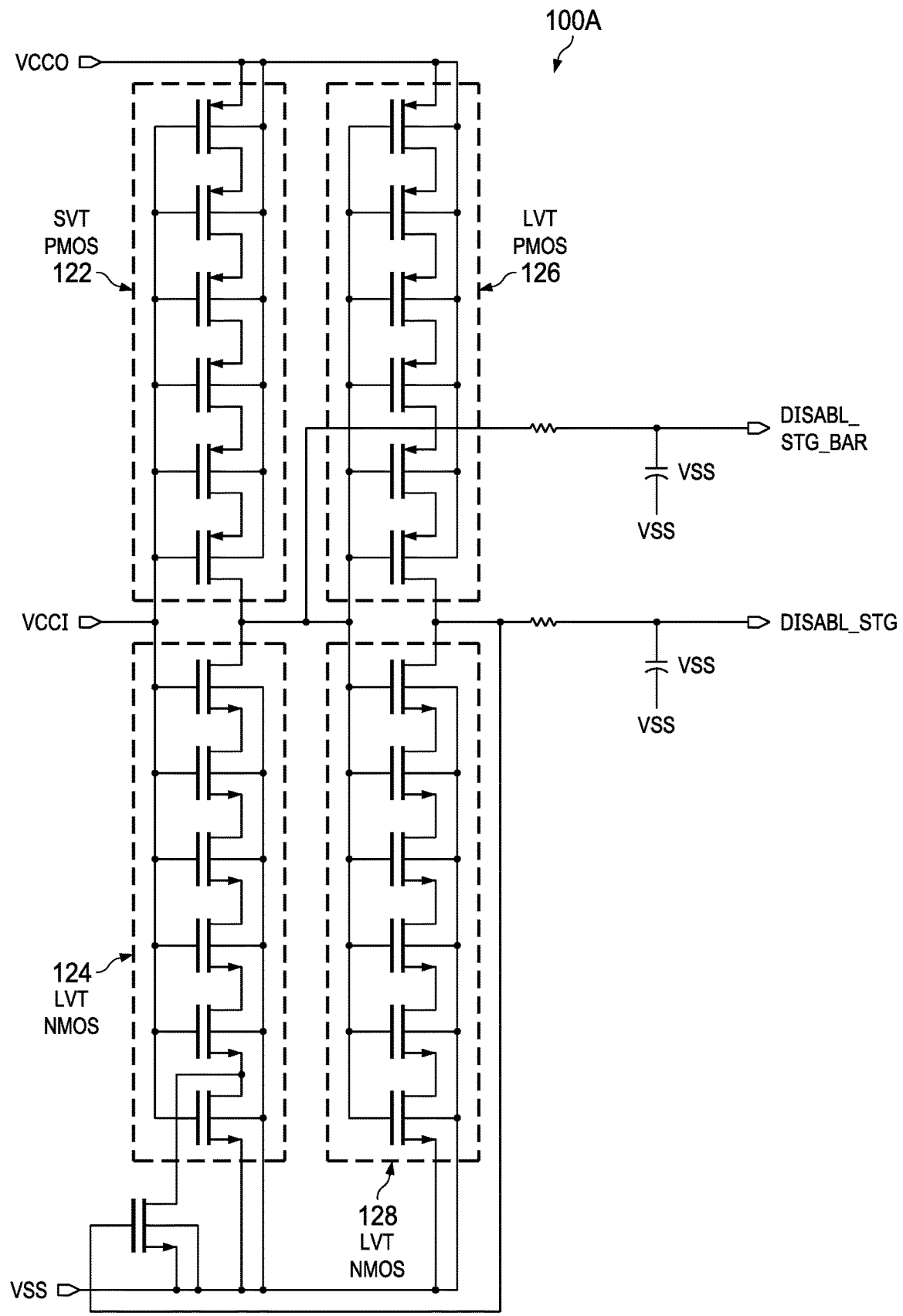
FIG. 1A depicts an example of a supply-difference sensing circuit used to disable unnecessary staggering according to an embodiment of the disclosure.

FIG. 1A depicts an example of a supply difference sensing circuit 100A that can provide disable-staggering signal DISABL_STG to disable staggering if the input supply voltage VCCI for a specific channel is greater than or equal to the VCCI trigger for a corresponding output supply voltage VCCO. In this embodiment, supply difference sensing circuit 100A is an inverter circuit that is composed of P-type metal oxide silicon (PMOS) transistors having standard voltage thresholds, PMOS transistors having low voltage thresholds and N-type metal oxide silicon (NMOS) transistors having low voltage thresholds. A first plurality of stacked PMOS transistors 122 that have standard voltage thresholds are coupled in series with a first plurality of stacked NMOS transistors 124 that have low voltage thresholds between the output supply voltage VCCO and the lower rail VSS. The gates of the first plurality of stacked PMOS transistors 122 and the gates of the first plurality of stacked NMOS transistors 124 each receive the input supply voltage VCCI. A point between the first plurality of stacked PMOS transistors 122 and the first plurality of stacked NMOS transistors 124 is coupled to provide a disable-staggering-bar signal DISABL-STG-BAR. A second plurality of stacked PMOS transistors 126 that have low voltage thresholds is also coupled in series with a second plurality of stacked NMOS transistors 128 that have low voltage thresholds between the output supply voltage and the lower rail, shown here as VSS. Disable-staggering-bar signal DISABL-STG-BAR is provided to the gates of the second plurality of stacked PMOS transistors 126 and the second plurality of stacked NMOS transistors 128, while a point between the second plurality of stacked PMOS transistors 126 and the second plurality of stacked NMOS transistors 128 is coupled to provide disable-staggering signal DISABL_STG.

An inverter circuit as commonly constructed, i.e., with all of the transistors having the same nominal threshold voltage, will switch between a low state and a high state at the midpoint of the voltage difference between the two rails. In FIG. 1A, by using standard Vt PMOS transistors and low Vt NMOS transistors, the transition between a low state and a high state is shifted to reflect the VCCI trigger Vtrigger, which can be used to provide disable-staggering signal DISABL_STG to close the first plurality of switches SP1-SPZ and the second plurality of switches SN1-SNZ and bypass staggering of output signal Vout. The VCCI trigger Vtrigger is based on the following equations:

$$Vtrigger = \frac{Vdd + \sqrt{\frac{\beta n}{\beta p}} * Vtn + Vtp}{\left(1 + \sqrt{\frac{\beta n}{\beta p}}\right)} \quad \text{Equation 1}$$

where Vdd is the output supply voltage VCCO used in output buffer 100,

Vtrigger is the input supply voltage VCCI at which staggering can be turned off, Vtn and Vtp are the threshold voltages of the low Vt NMOS transistors and the standard Vt PMOS transistors respectively, and The beta of the P-type transistors ($\beta p$) and the beta of the N-type transistors ($\beta n$) are defined by the equations:

$$\beta n = \mu n Cox \frac{Wn}{Ln} \text{ and} \qquad \text{Equation 2}$$

$$\beta p = \mu p Cox \frac{Wp}{Lp} \qquad \text{Equation 3}$$

where μn and μp are the mobility of the NMOS and PMOS dopants respectively,
Cox is the capacitance of the gate oxides,
Wn and Wp are the widths of the respective N-type and P-type transistors, and
Ln and Lp are the lengths of the respective N-type and P-type transistors.

Figure 1B:
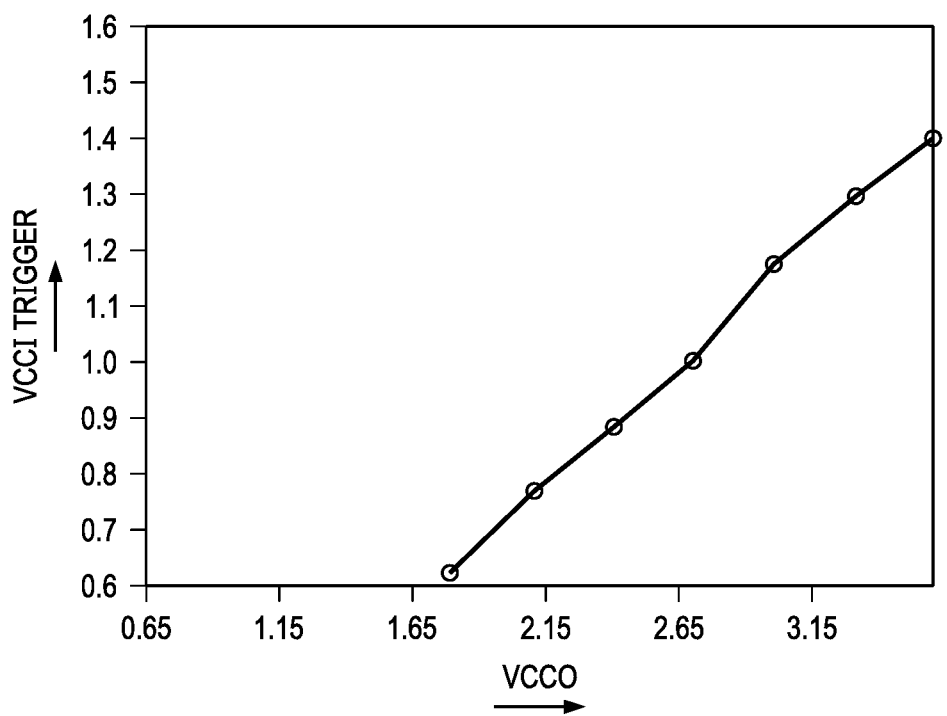
FIG. 1B depicts a graph of the relationship between an output supply voltage and a triggering voltage of an input supply voltage according to an embodiment of the disclosure.

FIG. 1B depicts a graph 100B that illustrates the correspondence between the output supply voltage VCCO and the corresponding VCCI trigger Vtrigger, while Table 2 below provides specific value of output supply voltages VCCO for the output buffer 100 and the corresponding VCCI trigger Vtrigger. If a corresponding input supply voltage VCCI is at or above the VCCI trigger Vtrigger, staggering can be safely turned off or bypassed without affecting overall noise:

TABLE 2

| VCCO (V) | VCCI trigger (V) |
|---|---|
| 3.6 | 1.417 |
| 3.3 | 1.3 |
| 3 | 1.18 |
| 2.7 | 1.004 |
| 2.4 | 0.886 |
| 2.1 | 0.768 |
| 1.8 | 0.624 |

Figure 2A:
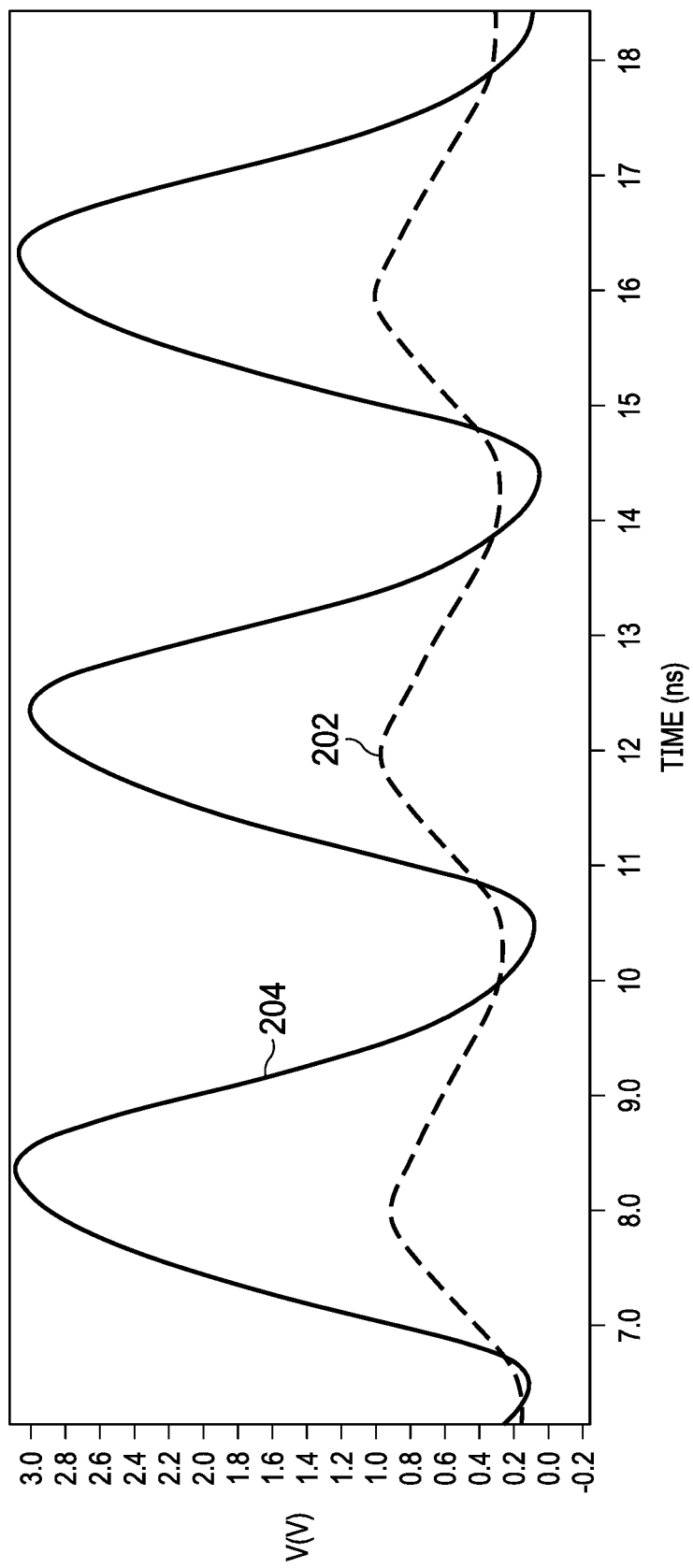
FIG. 2A depicts a graph depicting data rate simulations for a circuit with and without the supply-difference sensing circuit and associated switches.

FIG. 2A demonstrates a situation in which staggering is unnecessary and illustrates the loss of data rate that can result. Both output signals were recorded for an input voltage of 1.8 V and an output signal of 3.3 V, with an input data rate of 500 MBPS. Output signal 202 is produced by an output buffer that always applies staggering; output signal 202 has an output data rate of 350 MBPS. In contrast, output signal 204 is produced by an output buffer that turns off staggering when not needed. As can be determined from Table 2, an input voltage Vin of 1.8 V is above the 1.3 V value of VCCI trigger Vtrigger for an output voltage Vout of 3.3 V, so staggering was turned off in this case and a maximum output data rate of 500 MBPS was achieved.

Figure 2B:
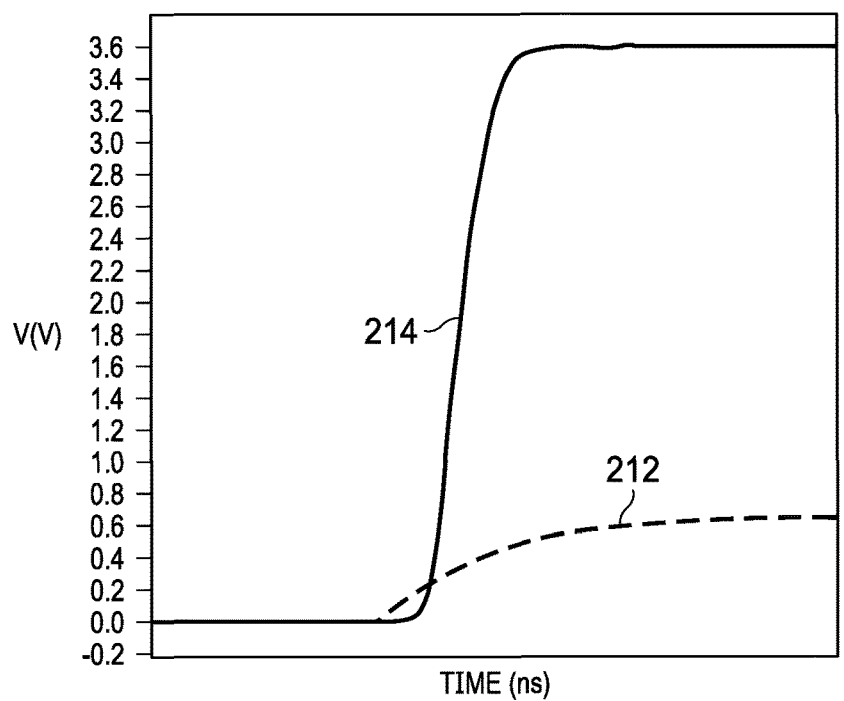
FIGS. 2B and 2C depicts the rising edge and the falling edge of signals from the first voltage domain to the second voltage domain and from the second voltage domain to the first voltage domain at a largest difference handled by the output buffer of FIG. 1 according to an embodiment of the disclosure.
Figure 2C:
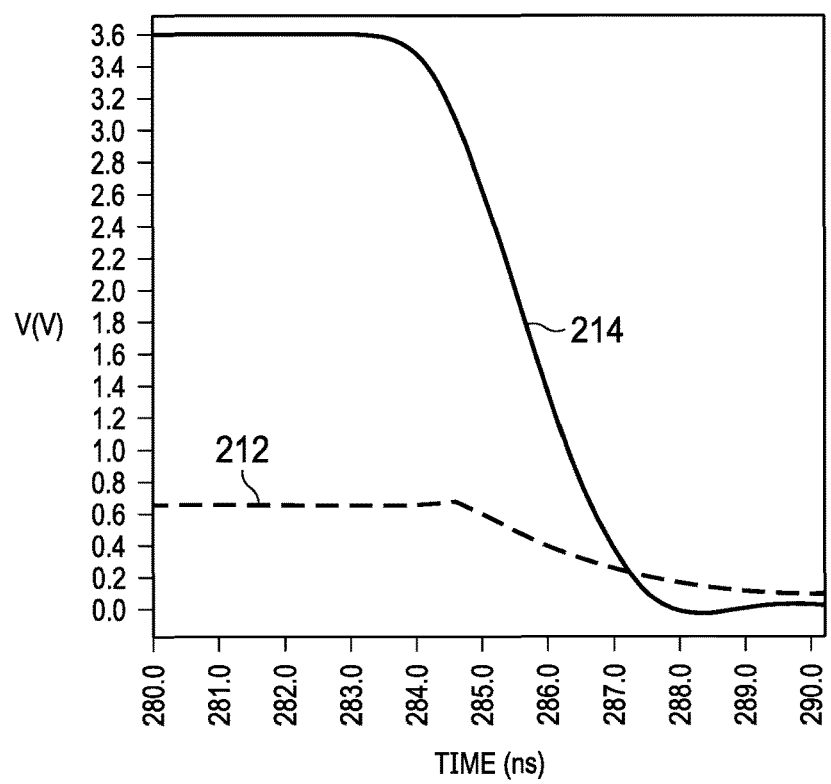

While output buffer 100 is able to provide the maximum output data rate when the input and output voltage are relatively close together, output buffer 100 is also able to provide clean signals for signals in both directions when the voltage difference is at the maximum. FIGS. 2B and 2C were produced with a voltage translator having a first supply voltage VCCA equal to 3.6 V and a second supply voltage VCCB equal to 0.65V. Output signal 212 is from a single channel operating in the A to B direction so that the output voltage operates in the 0.65 V domain. Output signal 214 represents three output signals from the remaining three channels, which all operate in the B to A direction, such that output signal 214 operates in the 3.6 V domain. FIG. 2B shows a rising edge of these signals and FIG. 2C shows a falling edge of the same signals. Monotonic behavior of output signals 212, 214 is observed, even with the large voltage difference. FIG. 2D depicts a condensed version of output signal 212, which operates in the 0.65 V domain. As seen in FIG. 2D, while some noise 216 is seen in this waveform, the use of boosters has ensured that output signal 212 rose quickly enough that there are no glitches below voltage out high (VOH) and no glitches above voltage out low (VOL).

Figure 3:
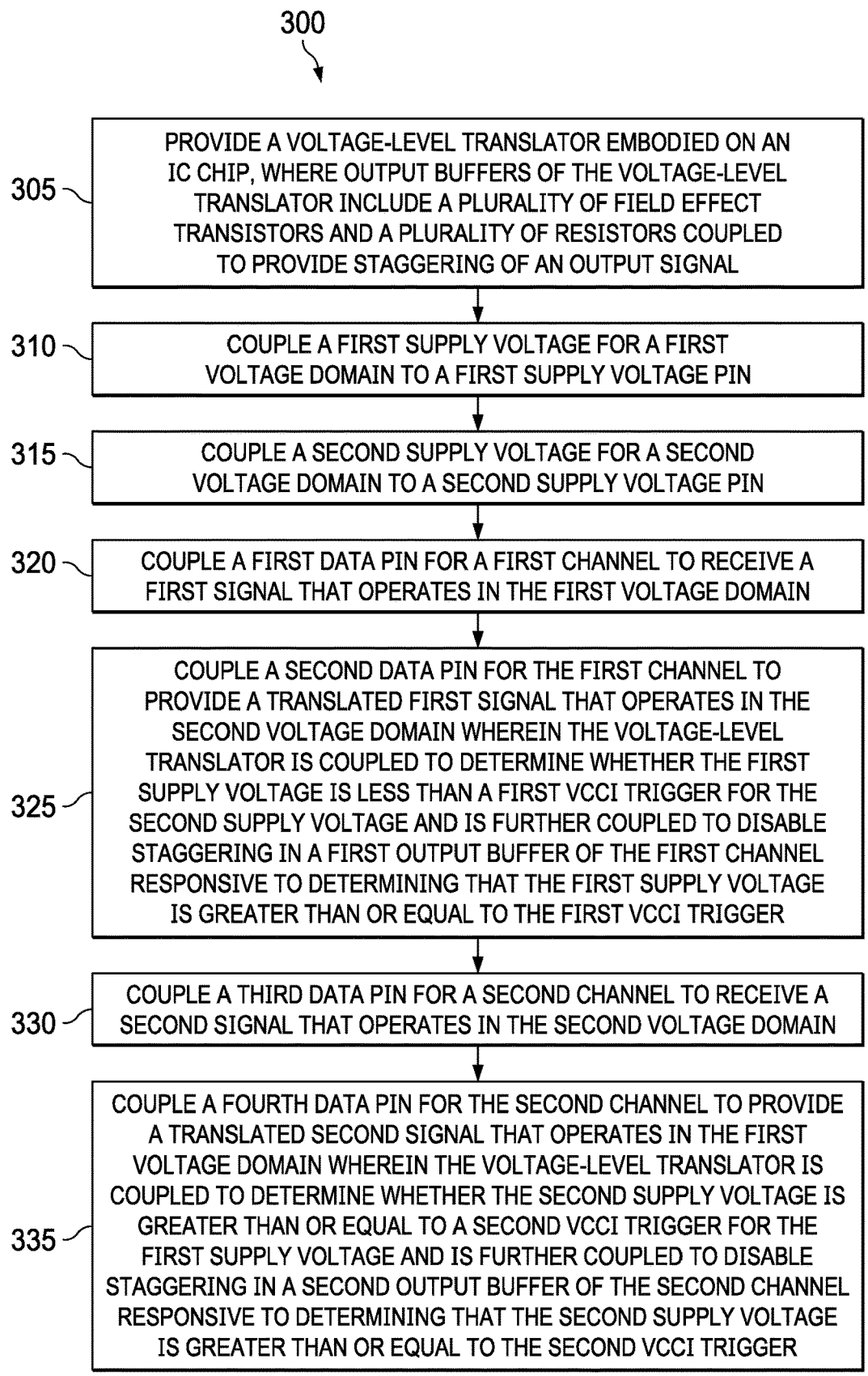
FIG. 3 depicts a method of operating a voltage translator according to an embodiment of the disclosure

FIG. 3 depicts a method 300 of operating a voltage-level translator according to an embodiment of the disclosure, i.e., a voltage-level translator that incorporates the output buffer 100. The method starts by providing 305 a voltage-level translator embodied on an IC chip. Output buffers of the voltage-level translator include a plurality of field effect transistors and a plurality of resistors coupled to provide staggering of an output signal. In one embodiment, the plurality of field effect transistors includes the first plurality of PMOS transistors MP1-MPZ and the first plurality of NMOS transistors MN1-MNZ and the plurality of resistors includes the plurality of first resistors RP1-RPZ and the plurality of second resistors RN1-RNZ. The method continues with coupling 310 a first supply voltage for a first voltage domain to a first supply voltage pin and coupling 315 a second supply voltage for a second voltage domain to a second supply voltage pin. A first data pin for a first channel is coupled 320 to receive a first signal that operates in the first voltage domain and a second data pin for the first channel is coupled 325 to provide a translated first signal that operates in the second voltage domain. The voltage-level translator is coupled to determine whether the first supply voltage is greater than or equal to a first VCCI trigger for the second supply voltage and is further coupled to disable staggering in a first output buffer of the first channel responsive to determining that the first supply voltage is greater than or equal to the first VCCI trigger.

A third data pin for a second channel is coupled 330 to receive a second signal that operates in the second voltage domain and a fourth data pin for the second channel is coupled 335 to provide a translated second signal that operates in the first voltage domain. The voltage-level translator is coupled to determine whether the second supply voltage is greater than or equal to a second VCCI trigger for the first supply voltage and is further coupled to disable staggering in a second output buffer of the second channel responsive to determining that the second supply voltage is greater than or equal to the second VCCI trigger.

It can be noted with regard to the comparison of a current input supply voltage VCCI to a VCCI trigger for the current output supply voltage VCCO, when the input supply voltage VCCI is greater than the output supply voltage VCCO, input supply voltage VCCI will always be greater than the corresponding VCCI trigger, so that staggering is always disabled in a channel that is translating from a higher voltage domain to a lower voltage domain. When the voltage difference between the input supply voltage VCCI and the output supply voltage VCCO, staggering may be disabled in both directions of translation.

Applicant has disclosed an output buffer for a voltage translator that is capable of handling translations across a large range of voltages. To maximize the data rate at all voltage translation combinations, staggering is applied when the voltage translation is from a lower voltage domain to a higher voltage domain and the difference between the two voltage domains is significant. At lower differences and when translating from a higher voltage domain to a lower voltage domain, staggering is disabled. This arrangement reduces the supply noise impact when the supply domains are far apart and does so without degrading the data rate. Turning off staggering when translating between two voltage domains that are closer to each other improves the data rate, propagation delay for these smaller voltage differences. A method for operating a voltage translator has also been disclosed.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A bidirectional voltage level translator circuit comprising:
    an input voltage input adapted to receive a first voltage of a first voltage domain, an output voltage input adapted to receive a second voltage of a second voltage domain, the second voltage being different from the first voltage, a ground rail, a signal input, and a signal output;
    an input buffer having an input coupled to the signal input, having an input buffer output, and being coupled to the input voltage input and the ground rail;
    an output buffer having a first gate control input and a second gate control input that are coupled to the input buffer output, having a buffer output coupled to the signal output, and being coupled to the output voltage input and the ground rail, the output buffer including:
        first resistors coupled in series with the first gate control input;
        first switches connected across the first resistors;
        first transistors having a standard threshold voltage (Vt), having gates coupled to the first gate control input through the first resistors, having first terminals coupled to the output voltage input, and having second terminals coupled to the buffer output;
        second resistors coupled in series with the second gate control input;
        second switches connected across the second resistors;
        second transistors having a standard threshold voltage, having gates coupled to the second gate control input through the second resistors, having first terminals coupled to the buffer output, and having second terminals coupled to the ground rail.

2. The bidirectional voltage level translator circuit of claim 1 including:
    a first inverter having an input coupled to the first gate control input and having a first inverted output;
    third transistors having gates coupled to the first inverted output, first terminals coupled to the output voltage input, and having second terminals coupled to the gates of the first transistors;
    a second inverter having an input coupled to the second gate control input and having a second inverted output;
    fourth transistors having gates coupled to the second inverted output, first terminals coupled to the gates of the second transistors, and having second terminals coupled to the ground rail.

3. The bidirectional voltage level translator circuit of claim 2 including:
    a first low threshold voltage (Vt) transistor having a gate coupled to the first inverted output, having a first terminal coupled to the output voltage input, and having a second terminal coupled to the buffer output; and
    a second low Vt transistor having a gate coupled to the second inverted output, a first terminal coupled to the buffer output, and having a second terminal coupled to the ground rail.

4. The bidirectional voltage level translator of claim 3 in which the output buffer includes a first boost input and a second boost input, and including:
    a first boost transistor having a gate coupled to the first boost input, having a first terminal coupled to the output voltage input, and having a second terminal coupled to the buffer output; and
    a second boost transistor having a gate coupled to the second boost input, having a first terminal coupled to the buffer output, and having a second terminal coupled to the ground rail.

5. The bidirectional voltage level translator chip circuit of claim 1 including a supply difference sensing circuit that includes:
    a first group of stacked P-type metal oxide silicon (PMOS) transistors coupled in series between the second voltage input and an inverted staggering output that is coupled to the second switches, each of the first plurality of stacked PMOS transistors having a standard Vt;
    a first group of stacked N-type metal oxide silicon (NMOS) transistors coupled in series between the inverted staggering output and the ground rail, each of the first plurality of stacked NMOS transistors having a low Vt, respective gates of the first plurality of stacked PMOS transistors and the first plurality of stacked NMOS transistors being coupled to the first voltage input;
    a second group of stacked PMOS transistors coupled in series between the second voltage input and a staggering output that is coupled to the first switches, each of the second group of stacked PMOS transistors having a standard Vt; and
    a second group of stacked NMOS transistors coupled in series between the staggering output and the ground rail, each of the second group of stacked NMOS transistors having a low Vt, respective gates of the second group of stacked PMOS transistors and of the second group of stacked NMOS transistors being coupled to the inverted staggering output.

6. The bidirectional voltage level translator circuit of claim 5 including:
    a voltage translator circuit having an input the input buffer output and having a translator output; and
    a gate control circuit having an input coupled to the translator output and having a first gate control output coupled to the first gate control input, and having a second gate control output coupled to the second gate control input.

7. The bidirectional voltage level translator circuit of claim 1 including an integrated circuit that includes the bidirectional voltage level translator circuit.

8. The bidirectional voltage level translator circuit of claim 1 in which the first voltage and the second voltage are each in a range between 0.65 volts and 3.6 volts.

9. An output buffer for a translator circuit comprising:
    a first gate control input, a second gate control input, an output voltage input, a ground rail, and a buffer output;

first resistors coupled in series with the first gate control input;
first switches connected across the first resistors;
first transistors having a standard threshold voltage, having gates coupled to the first gate control input through the first resistors, having first terminals coupled to the output voltage input, and having second terminals coupled to the buffer output;
second resistors coupled in series with the second gate control input;
second switches connected across the second resistors;
second transistors having a standard threshold voltage, having gates coupled to the second gate control input through the second resistors, having first terminals coupled to the buffer output, and having second terminals coupled to the ground rail.

10. The output buffer of claim 9 including:
a first inverter having an input coupled to the first gate control input and having a first inverted output;
third transistors having gates coupled to the first inverted output, first terminals coupled to the output voltage input, and having second terminals coupled to the gates of the first transistors;
a second inverter having an input coupled to the second gate control input and having a second inverted output;
fourth transistors having gates coupled to the second inverted output, first terminals coupled to the gates of the second transistors, and having second terminals coupled to the ground rail.

11. The output buffer of claim 10 including:
a first low Vt transistor having a gate coupled to the first inverted output, having a first terminal coupled to the output voltage input, and having a second terminal coupled to the buffer output; and
a second low Vt transistor having a gate coupled to the second inverted output, a first terminal coupled to the buffer output, and having a second terminal coupled to the ground rail.

12. The output buffer of claim 11 in which the output buffer includes a first boost input and a second boost input, and including:
a first boost transistor having a gate coupled to the first boost input, having a first terminal coupled to the output voltage input, and having a second terminal coupled to the buffer output; and
a second boost transistor having a gate coupled to the second boost input, having a first terminal coupled to the buffer output, and having a second terminal coupled to the ground rail.

13. A process of operating a voltage-level translator circuit comprising:
(a) receiving a first voltage of a first voltage domain on first voltage input;
(b) receiving a second voltage of a second voltage domain on a second voltage input, the second voltage being different from the first voltage;
(c) receiving a first signal from the first voltage domain on a first signal input;
(d) providing a second signal to the second voltage domain on a second signal output in response to receiving the first signal;
(e) staggering the providing the second signal; and
(f) disabling the staggering when the first voltage is greater than the second voltage.

14. The process of claim 13 in which the staggering includes opening switches in a staggering circuit in an output buffer.

15. The process of claim 13 in which the disabling includes closing switches in a staggering circuit in an output buffer.

16. The process of claim 13 in which the first voltage and the second voltage are each between 0.65 volts and 3.6 volts.

* * * * *